United States Patent [19]

Kamian

[11] Patent Number: 5,113,789

[45] Date of Patent: May 19, 1992

[54] SELF CLEANING FLOW CONTROL ORIFICE

[75] Inventor: George D. Kamian, Santa Cruz, Calif.

[73] Assignee: Watkins Johnson Company, Palo Alto, Calif.

[21] Appl. No.: 513,807

[22] Filed: Apr. 24, 1990

[51] Int. Cl.$^5$ .................. C23C 16/00; C23C 16/54
[52] U.S. Cl. ................. 118/715; 118/733; 118/719; 15/256.5
[58] Field of Search ........... 118/715, 718, 719, 733; 15/256.5

[56] References Cited

U.S. PATENT DOCUMENTS 4,834,020  5/1989  Bartholomew et al. ........... 118/719
4,982,610  1/1991  Gordon et al. ..................... 73/706

FOREIGN PATENT DOCUMENTS 63-250464  10/1988  Japan .

Primary Examiner—Shrive Beck
Assistant Examiner—Margaret Burke
Attorney, Agent, or Firm—Flehr, Hohbach, Test, Albritton & Herbert

[57] ABSTRACT

A self cleaning flow control orifice mounted in an exhaust line. A toroid having a rounded inner surface is mounted in the exhaust line and forms an orifice. A cleaning device is mounted in a manner to provide close contact between the cleaning device and the rounded surface. The toroid and cleaning device are rotated relative to one another so that the cleaning device rides over the rounded surface to clean the surface. The clean surface thereby insures proper functioning of the exhaust system of an atmospheric pressure chemical vapor deposition apparatus used to deposit films on substrates and wafers.

17 Claims, 4 Drawing Sheets 5,113,789

SELF CLEANING FLOW CONTROL ORIFICE

BRIEF DESCRIPTION OF THE INVENTION

This invention relates to a self cleaning flow control orifice for use in an exhaust system. More particularly, it relates to a self cleaning flow control orifice for use in the exhaust system of an atmospheric pressure chemical vapor deposition apparatus used to deposit films on wafers or substrates.

BACKGROUND OF THE INVENTION

An apparatus for producing films or layers on substrates or wafers by conveyorized atmospheric pressure chemical vapor deposition (APCVD) is described in U.S. Pat. No. 4,834,020 and owned by the assignee of the present invention. This patent is expressly incorporated by reference herein.

In general, an APCVD apparatus includes a conveyor belt which transports a wafer or substrate into one or more coating chambers. The coating chambers include means for creating and maintaining a chemical vapor atmosphere at the wafer or substrate surface such that a reaction of the chemical vapors with the wafer or substrate can transpire and thereby produce a deposited film on the wafer or substrate.

An important element in creating and maintaining the chemical vapor atmosphere at the wafer surface is the exhaust system. The gases must be introduced and exhausted at a uniform rate across the wafer or substrate in order to provide the proper residence time for the reacting chemicals over the surface.

A variety of problems result when the exhaust system does not function properly. When the chamber is exhausted too quickly it results in a loss of deposition. If the chamber is exhausted too slowly, the gas flows are undefined, resulting in particle generation. If the exhaust rate fluctuates with time, substrate uniformity and particle control is compromised.

Thus, to avoid these problems and otherwise insure proper functioning of the APCVD apparatus, one must precisely control the exhaust flow rate. A traditional solution is to install a flowmeter in each exhaust or vent line of the exhaust system. This solution, however, is of limited usefulness since the byproducts of the reaction from the chemical vapor are generally abrasive, corrosive, and adherent. Consequently, the vent line accumulates debris and renders the flow meter inoperative.

Another solution is to put a restriction in each vent line and thereby create an orifice restriction area. Flow through an orifice is proportional to the orifice's area times the square root of the pressure drop. Therefore, if the orifice is small, the pressure differential is large and the flow can be easily and accurately controlled by the pressure. Unfortunately, as debris accumulates around the orifice restriction area, the orifice changes size and flow control is lost.

To prevent this debris accumulation which hampers the proper functioning of the exhaust system, self-cleaning orifices have been devised. One such device utilizes a wire to regularly wipe the orifice. Another device utilizes opposing rollers and wipers to create and maintain a constant orifice restriction area.

The problems associated with these prior art solutions are readily recognizable. Utilization of the wire yields limited results since the wire is capable of little more than rudimentary swipes at the orifice. In addition, the wire only cleans the orifice itself and does not clear the debris which gathers over the entire orifice restriction area or on the wire itself. This debris obstructs normal gas flow.

The roller solution presents its own class of problems. First, the design relies upon concentric parts machined to exacting tolerances. Manufacturing such devices is difficult. Once manufactured and installed, it is difficult to maintain a constant orifice. Moreover, the design is difficult to seal: as a result, toxic chemicals can leak from the tube connections and orifice roller shafts. Aside from the health problems associated with the toxic chemicals leaking from an exhaust system, those chemicals tend to adhere to the rollers, notwithstanding the wipers, causing the rollers to jam, or even stop turning.

Under either approach, one is forced to stop the apparatus periodically to provide a thorough cleaning of the orifice restriction area in order to insure proper functioning of the exhaust system.

OBJECTS AND SUMMARY OF THE INVENTION

Thus, it is an object of the present invention to provide an efficient self cleaning orifice restriction area for use within atmospheric chemical vapor deposition equipment.

It is a more particular object of the present invention to provide an orifice restriction area which is simple to manufacture.

Another object of the present invention is to provide an orifice restriction area which minimizes leakage from the exhaust system.

Still another object of the present invention is to provide a mechanism for clearing the entire orifice restriction area.

Finally, it is an object of the present invention to provide an apparatus which enables extended operation of an exhaust system between down-time cleaning of the orifice restriction area.

These and other objects are achieved by a self cleaning flow control orifice mounted in an exhaust line. A toroid having a rounded inner surface is mounted in the exhaust line and forms an orifice. A cleaning device is positioned in a manner to provide close contact between the cleaning device and the rounded surface. The toroid and cleaning device are rotated relative to one another so that the cleaning device rides over the rounded surface to clean the surface.

BRIEF DESCRIPTION OF THE DRAWINGS

Other objects and advantages of the invention will become apparent upon reading the following detailed description and upon reference to the drawings, in which.

DETAILED DESCRIPTION OF THE INVENTION

Figure 1:
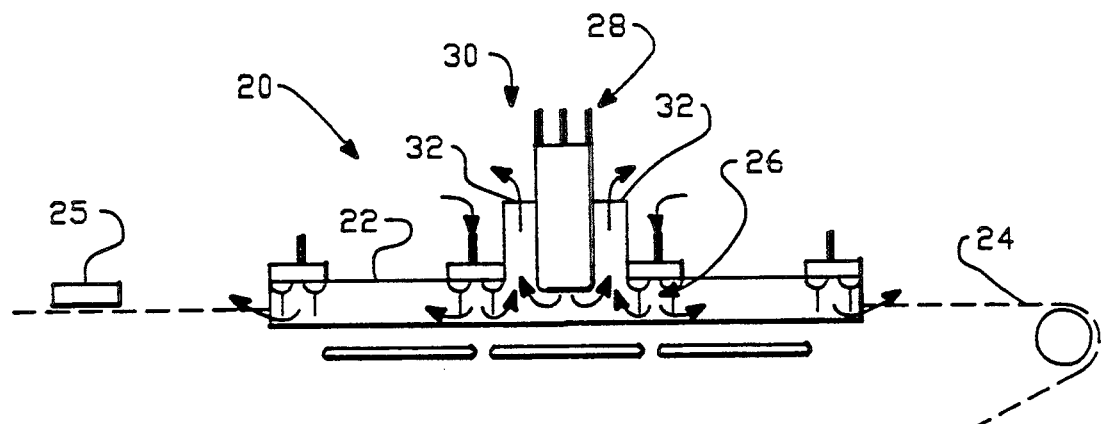
FIG. 1 is a cross sectional view of an atmospheric chemical vapor deposition apparatus.

Turning now to the drawings, wherein like components are designated by like reference numerals in the various figures, attention is initially directed to FIG. 1. The figure represents a cross sectional view of an atmospheric pressure chemical vapor deposition apparatus 20. The apparatus 20 includes a muffle 22 and a conveyor belt 24. The conveyor belt 24 delivers a substrate or wafer 25 into the muffle 22. Within the muffle 22 is a coating chamber 26. The wafer or substrate 25 moves along the conveyor belt 24 into the muffle 22 toward the coating chamber 26. In the coating chamber 26, the chemical delivery system 28 produces a chemical vapor atmosphere. Consequently, as the wafer or substrate 25 passes through the chemical vapor atmosphere within the coating chamber 26, a reaction between the vapor and the wafer or substrate 25 occurs. As a result of the reaction a film is deposited on the wafer or substrate 25.

The coating chamber 26 also includes an exhaust system 30 including exhaust lines 32. The exhaust system 30 insures that the gases within the coating chamber 26 are exhausted at a uniform rate in order to provide proper reaction time between the gases and the wafer or substrate 25. If the gases are exhausted too quickly, there is a loss of deposition. On the other hand, if the chamber is exhausted too slowly, the gas flows are undefined, resulting in particle generation. If the exhaust rate fluctuates with time, substrate uniformity and particle control is lost.

The exhaust lines 32 serve an important role in the proper functioning of the exhaust system 30. The rate of exhaust is controlled through the exhaust line 32. More particularly, an orifice restriction is placed in the exhaust line 32. The flow through the orifice is proportional to the size of the orifice times the square root of pressure. Thus, if the opening is small, the pressure differential is large. Consequently, the flow can be readily controlled with great accuracy by manipulating the pressure differential.

The pressure differential is the difference between room pressure and vent system pressure. If the pressure is large, as in the case of a small orifice, small variations in the pressure of the room housing the APCVD or within the exhaust line 32 do not significantly effect the flow rate. Therefore, the exhaust system operates more steadily.

While the importance of a small orifice is readily appreciable, realization of this structure is difficult. The exhaust lines 32 remove byproducts from chemical reactions within the coating chamber 26; these byproducts are abrasive, corrosive, and adherent. As a result, these byproducts, or debris, accumulate around the orifice and diminish its size. A small variation in orifice size greatly affects flow control.

Figure 2:
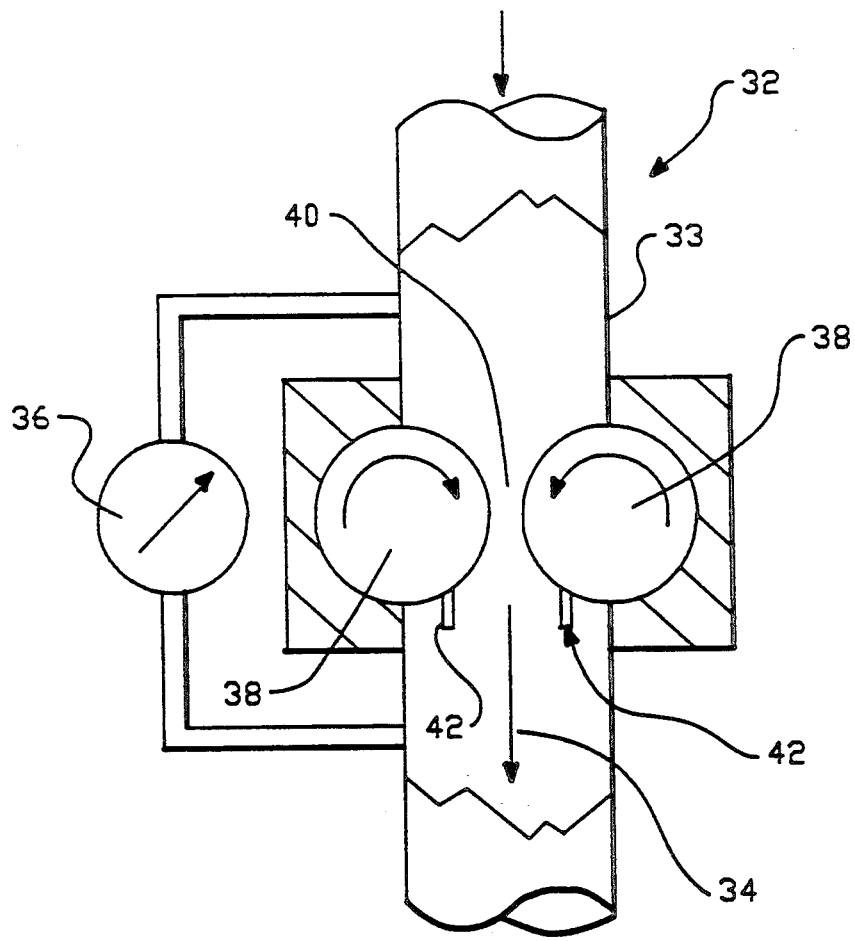
FIG. 2 is a cross sectional view of an opposing roller and wiper self cleaning orifice of an exhaust line of an atmospheric chemical vapor deposition apparatus in accordance with the prior art.

A prior art approach to the problem of accumulation of debris around an orifice is illustrated in FIG. 2. The figure depicts a cross sectional view of an exhaust line 32. The exhaust line 32 includes a central longitudinal axis defined by arrow 34. Exhaust gases move through the exhaust line 32 generally along the central longitudinal axis 34. Pressure is measured by a pressure gauge 36.

A pair of rollers 38 are positioned along the exhaust line walls 33 and serve to define an orifice 40. Under this approach, accumulated debris is removed by rotating rollers 38 against wipers 42.

This solution relies upon the precise proportions of the rollers 38. Concentric parts are difficult to machine to exacting tolerances. This design is also problematic inasmuch as it is difficult to seal. The toxic chemicals of the exhaust line 32 tend to leak behind the rollers 38. Finally, despite the wipers 42, debris accumulates on the rollers, causing them to jam or stop turning, after prolonged periods of usage.

Figure 3:
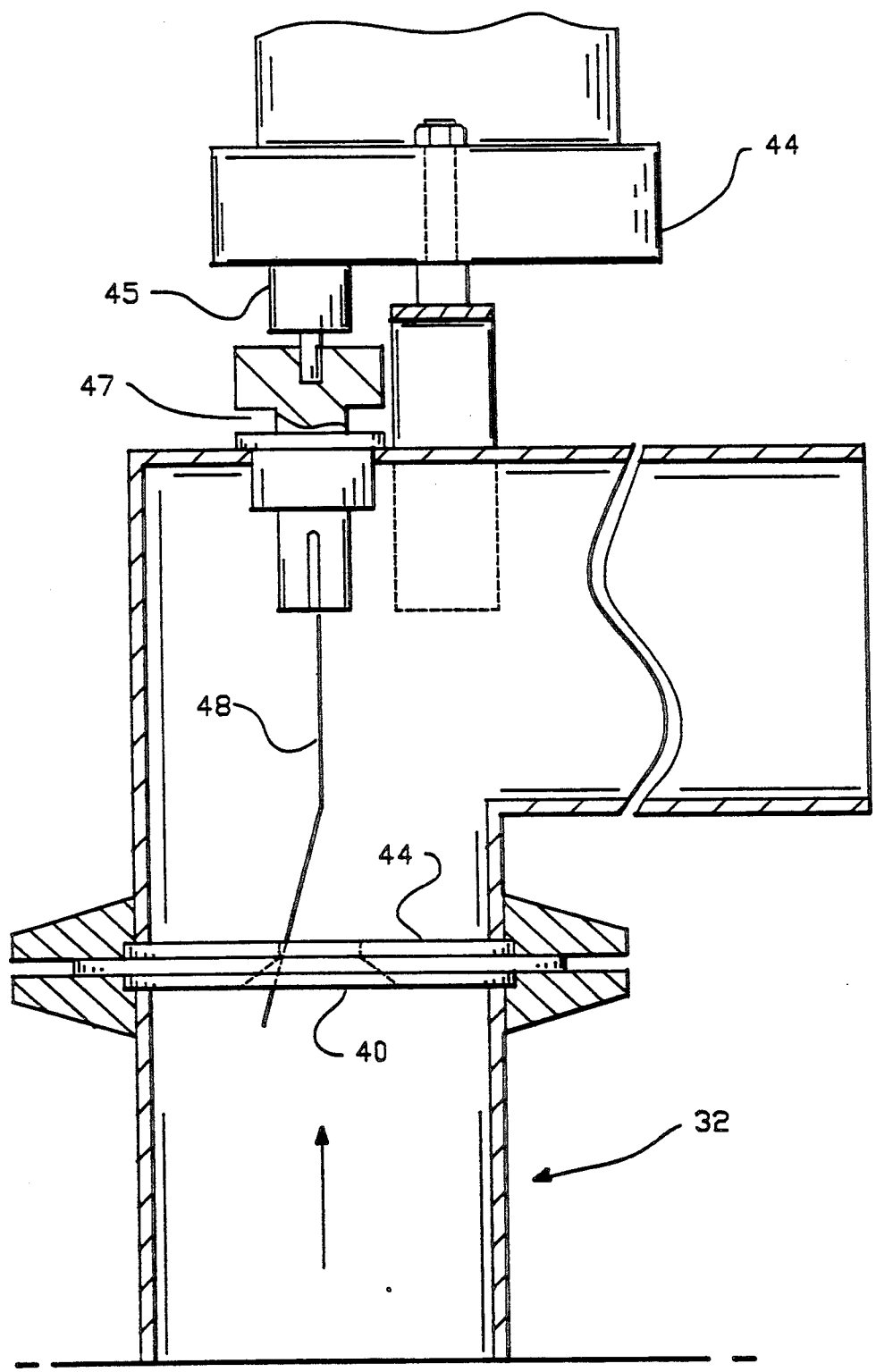
FIG. 3 is a cross sectional view of a driven wire self cleaning orifice of an exhaust line of an atmospheric chemical vapor deposition apparatus in accordance with the prior art.

FIG. 3 displays another prior art attempt to solve this problem. In the figure, an exhaust line 32 is depicted. The exhaust line 32 includes a plate 44 positioned perpendicular to the central longitudinal axis 34. The plate 44 includes an orifice 40 which restricts the exhaust flow. Positioned on the exhaust line 32 is a motor 44. The motor 44 has a bottom mounted gear 45 which is connected to a wire mount 47 which holds bent wire 48. The wire 48 is rotated by the motor 44 and serves to scrape the orifice 40. The wire 48 does not provide a particularly effective means for clearing the orifice. As can be appreciated in viewing the figure, the wire is unable to reach the portions of the orifice depicted by lines in phantom. Therefore, debris accumulates and obstructs normal gas flow.

Figure 4:
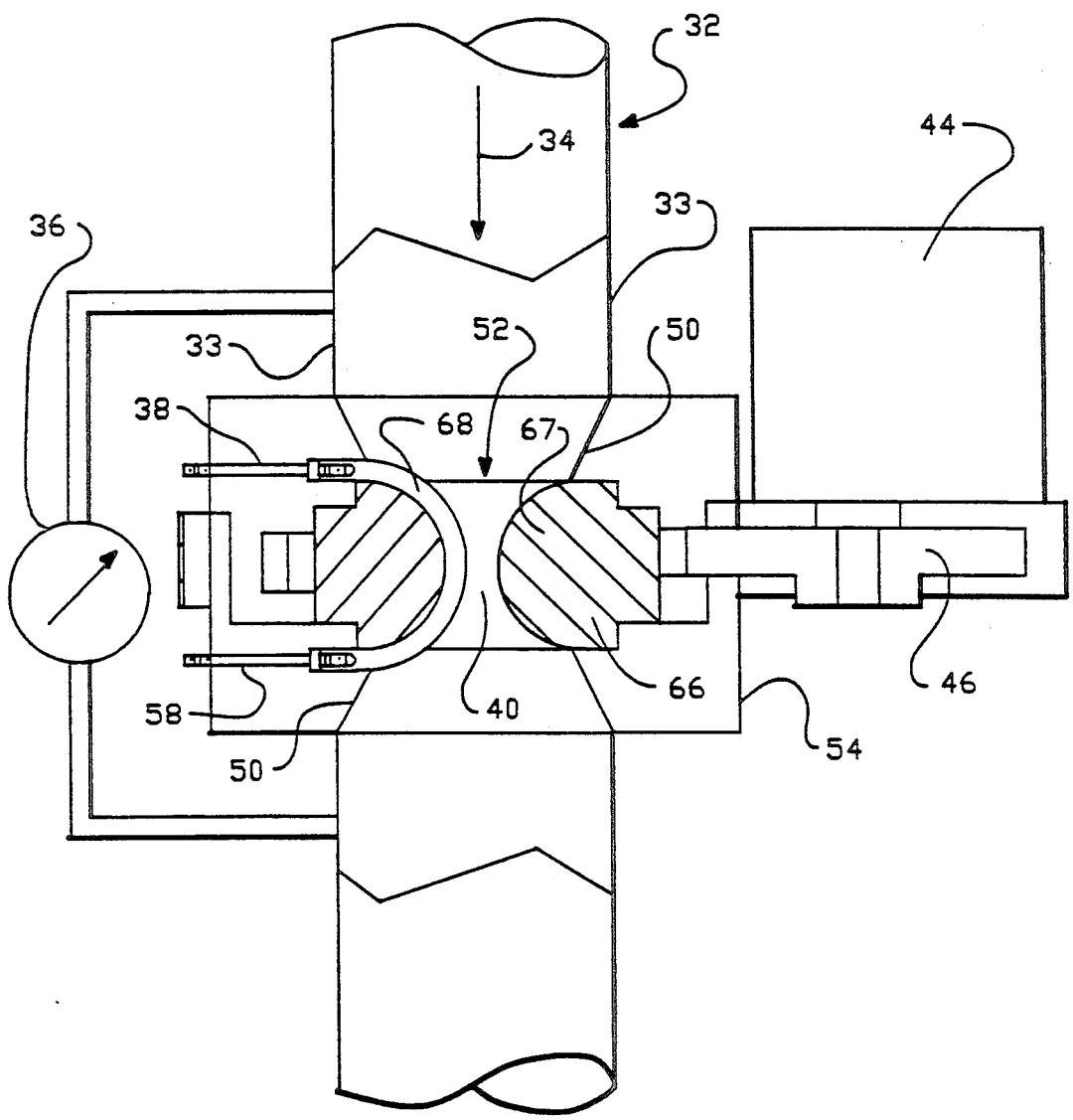
FIG. 4 is a cross sectional view of the self cleaning orifice of the present invention.
Figure 5:
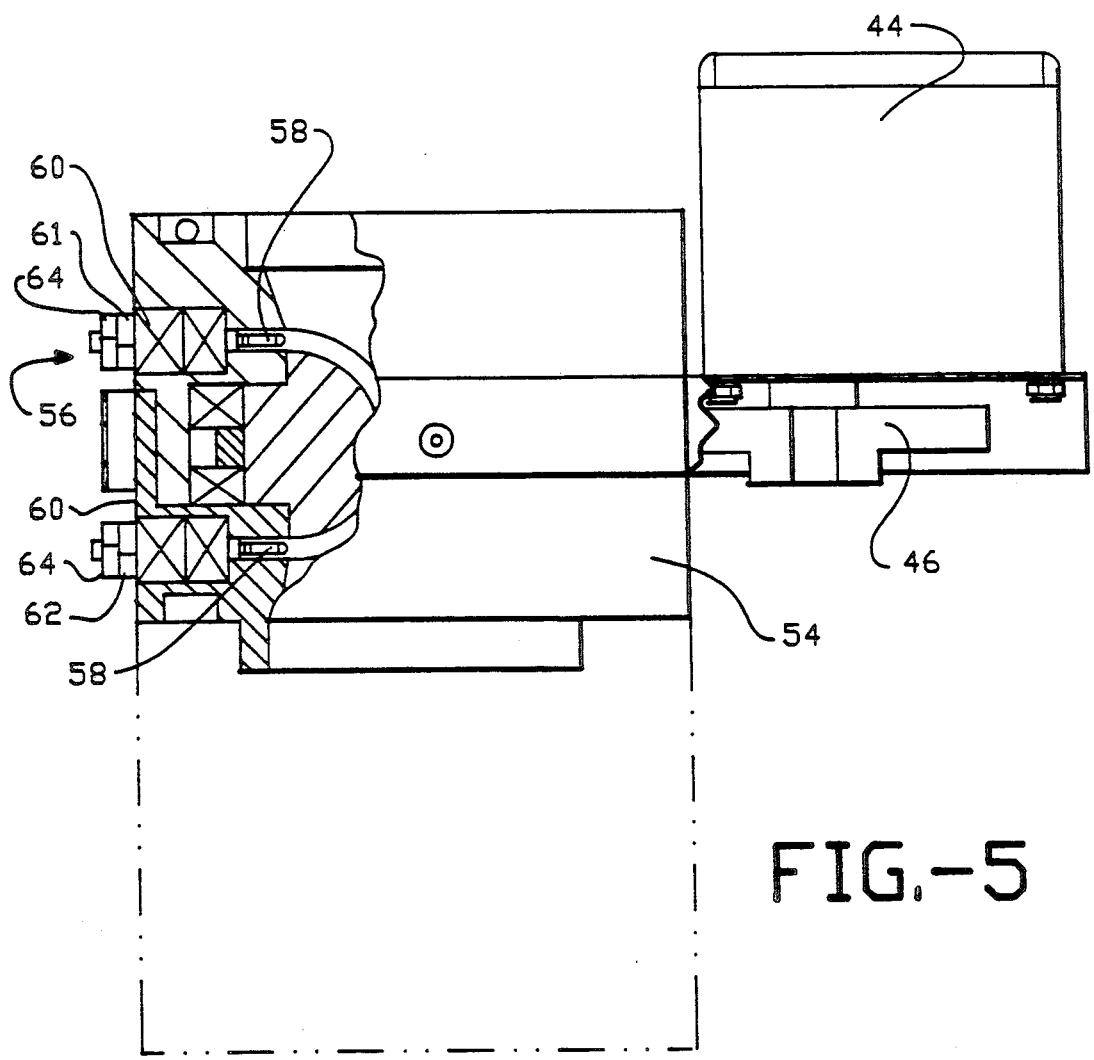
FIG. 5 is a detailed cross sectional view of the self cleaning orifice apparatus of the present invention.

The shortcomings associated with the prior art are obviated by the invention disclosed in FIGS. 4 and 5. FIG. 4 depicts an exhaust line 32. In a preferable embodiment, the exhaust line walls 33 include a tapered portion 50 leading to the orifice restriction area 52. The exhaust line is equipped with a pressure gauge 36.

As seen in both FIGS. 4 and 5, adjacent to the exhaust line is a motor 44 including a gear 46. The gear 46 reaches into an orifice restriction area housing 54. Preferably, the housing 54 is anodized and TEFLON (polytetrafluoroethylene) impregnated. The interface between the gear 46 and the orifice restriction area housing 54 is sealed to prevent leakage of toxic gases from the exhaust line 32, a problem associated with the prior art.

As best seen in FIG. 5, a spring mounting 56 is positioned on the opposite side of the housing 54. Preferably, the spring mounting includes a threaded stud 58 which extends through a bearing 60, a washer 62 and nut 64. These elements form a seal with the housing 54 to minimize the prior art shortcoming of leakage of toxic gases from the orifice restriction area 52.

Attention now returns to the orifice restriction area 52, as depicted in FIG. 4. The orifice 40 is defined by a toroid 66 which is concentric with the exhaust line 32. The toroid 66 has a rounded inner surface 67. FIG. 4 simply depicts the concentric toroidal member 66 in cross section. In contrast to the rollers of the prior art, this toroid member 66 is relatively easy to manufacture.

Referring now to the left hand portion of the cross section of the concentric toroid member 66, a spring 68 is depicted as being positioned over the rounded inner surface 67. The spring is secured at its ends to shafts 58 which ride on bearings 60 which are attached to the housing 54 as previously described. Preferably, the top and bottom shafts 58 are aligned so that spring 68 is in alignment with the central longitudinal axis 34 of the exhaust line 32.

In one example the dimensions of toroid 66 and spring 68 were as follows. The thickness of the toroidal member 66 was approximately 1.250 inches and the rounded surface 67 had a radius of approximately 0.625 inches. The orifice 40 was approximately 0.375 inches in diameter, preferably the spring 68 and toroid member 66 are covered by a layer of titanium nitride to inhibit corrosion and reduce wear.

Figure 6:
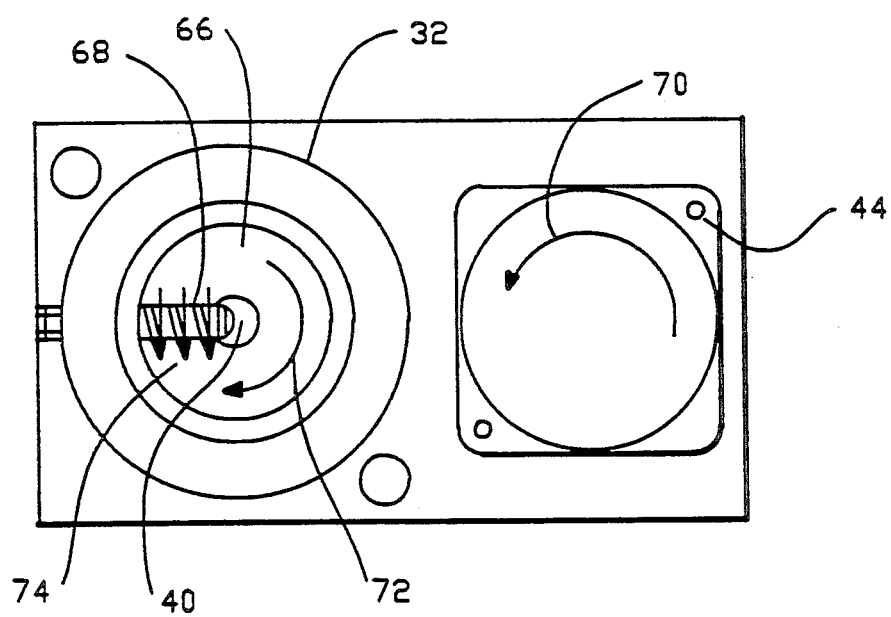
FIG. 6 is a top view of a portion of the present invention depicting a manner of rotation of various components.

Debris is removed from the orifice restriction area 52 in the following manner. The exhaust line toroid 66 is rotated by the gear 45 which is driven by motor 44. Preferably, the exhaust line toroid 66 turns at approximately 2 RPMs. The rotation of the exhaust line toroid 66 induces the rotation of the spring 68 which is in intimate contact with rounded surface 67. This can be appreciated by reference to FIG. 6. This Figure represents a top view of the exhaust line toroid 66 and the motor 44. In this embodiment, the motor rotates in the direction indicated by arrow 70 which induces the exhaust line toroid 66 to rotate in the direction indicated by arrow 72. Contact between rounded surface 67 and spring 68 induces the spring 68 to rotate in bearings 60 in the manner indicated by arrow 74.

This rotating action by spring 68 which is in contact with rounded surface 67 of toroid member 66 serves to clean the orifice restriction area 52 free from debris. Note the relatively widespread cleaning action associated with the present invention; prior art approaches merely cleared a limited area which did not necessarily include the immediate ingress and egress path to the orifice 40.

The effectiveness of the present invention is enhanced by the fact that the spring 68 experiences different surface speeds along the varying radius of the toroid member 66. These differences in speed cause additional brushing between the spring 68 and the toroid member 66 which enhances the cleaning action of both the toroid member 66 and the spring 68 itself. The exhaust stream removes the loosened debris from both elements.

The invention disclosed herein has proved to be extremely effective in removing debris from the orifice restriction area 52. Prior art self-cleaning orifices were operative for approximately 8 hours before a downtime cleaning was necessary. With the present invention, one may expect efficient operation for 40 hours before a down-time cleaning is necessary.

Thus, it is apparent that there has been provided, in accordance with the invention, a self cleaning orifice restriction area within the exhaust system of an atmospheric pressure chemical vapor deposition apparatus, which fully satisfies the objects, aims, and advantages set forth above. While the invention has been described in conjunction with specific embodiments thereof, it is evident that many alternatives, modifications, and variations will be apparent to those skilled in the art in light of the foregoing description. Accordingly, it is intended to embrace all such alternatives, modifications, and variations as fall within the spirit and scope of the appended claims.

What is claimed is:

1. A self cleaning flow control orifice for mounting in an exhaust line comprising:
    a toroid, having a rounded inner surface, mounted in said exhaust line and forming an orifice,
    a cleaning member in intimate contact with said rounded surface, and
    means for rotating said toroid so that said cleaning member moves over said rounded surface to clean said surface.

2. The apparatus of claim 1 wherein said cleaning member is a spring rotatably supported at its ends.

3. The apparatus of claim 2 wherein said spring includes a titanium nitride coating.

4. The apparatus of claim 1 wherein said rounded surface is coated with titanium nitride.

5. The apparatus of claim 1 wherein said toroid is externally surrounded by a housing.

6. The apparatus of claim 5 wherein said housing is anodized and TEFLON impregnated.

7. The apparatus of claim 5 wherein said housing supports fastening means for coupling said cleaning member to said housing.

8. The apparatus of claim 7 wherein said fastening means and said housing are securely sealed.

9. The apparatus of claim 5 wherein said means for rotating include a motor positioned adjacent to said housing, said motor including a gear which drives said toroid.

10. The apparatus of claim 9 wherein an interface between said gear and said housing is securely sealed.

11. The apparatus of claim 1 wherein said exhaust line includes tapered walls leading to said toroid.

12. A self cleaning flow control orifice for mounting in an exhaust line comprising:
    a toroid, with a rounded inner surface, mounted in said exhaust line and forming an orifice, said inner surface including a coating of titanium nitride;
    a spring, coated with titanium nitride, in intimate contact with said rounded surface;
    a housing surrounding and enclosing said toroid of said exhaust line, said housing being anodized and teflon impregnated, said housing supporting means to fasten and seal said spring; and
    a motor positioned adjacent to said housing and including a sealed interface with said housing, said motor including a gear which extends into said housing and drives said toroid such that said toroid rotates relative to said spring, thereby cleaning said inner surface of said toroid.

13. In an atmospheric pressure chemical vapor deposition apparatus for depositing films on wafers or substrates, said apparatus including a conveyor belt, a muffle, and a coating chamber with a chemical delivery system and an exhaust system, said coating chamber being positioned within said muffle such that said conveyor belt delivers said wafers or substrates to said coating chamber whereby said chemical delivery system distributes chemical vapors over the surface of said wafer or substrate for reaction and resultant film deposition on the surface of said wafer or substrate, said chemical vapors being subsequently evacuated from said coating chamber by said exhaust system, the improvement comprising an exhaust system which includes:
    an exhaust line with tapered walls leading to an orifice restriction area, said orifice restriction area including a toroid with a rounded inner surface, and a spring in intimate contact with said toroid;
    a housing externally surrounding said orifice restriction area, said housing rotatably supporting said spring; and
    a motor positioned adjacent to said housing, said motor including a gear to drive said toroid such that said toroid rotates and thereby produces cleaning between said spring and said toroid such that debris is removed from said orifice restriction area.

14. The improvement of claim 13 wherein said orifice restriction area is coated with titanium nitride.

15. The improvement of claim 13 wherein said housing is anodized and TEFLON impregnated.

16. The improvement of claim 13 wherein the connection between said housing and said spring is sealed.

17. The improvement of claim 13 wherein the connection between said gear and said housing is sealed.

* * * * *